(12) United States Patent
Lee et al.

(10) Patent No.: US 9,460,957 B2
(45) Date of Patent: Oct. 4, 2016

(54) METHOD AND STRUCTURE FOR NITROGEN-DOPED SHALLOW-TRENCH ISOLATION DIELECTRIC

(71) Applicant: Taiwan Semiconductor Manufacturing Company, Ltd., Hsin-Chu (TW)

(72) Inventors: Shing Long Lee, Hsinchu (TW); Yi-Chieh Wang, Taipei (TW); Chung-Han Lin, Jhubei (TW); Kuang-Jung Peng, Hsinchu (TW); Yun Chang, Hsinchu (TW); Shou-Wen Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/021,608

(22) Filed: Sep. 9, 2013

(65) Prior Publication Data

US 2014/0264720 A1     Sep. 18, 2014

Related U.S. Application Data

(60) Provisional application No. 61/778,254, filed on Mar. 12, 2013.

(51) Int. Cl.
*H01L 21/762* (2006.01)
*H01L 21/02* (2006.01)

(52) U.S. Cl.
CPC ... *H01L 21/76237* (2013.01); *H01L 21/02126* (2013.01); *H01L 21/02271* (2013.01)

(58) Field of Classification Search
CPC .............. H01L 21/02112; H01L 21/76237; H01L 21/76224; H01L 21/3145; H01L 21/76229

USPC .......... 257/506, 510, E21.546, E29.02, 622, 257/513, 639, E21.269; 438/437, 430, 424, 438/608, 434, 785, 766, 786

See application file for complete search history.

(56) References Cited

U.S. PATENT DOCUMENTS

| 4,855,804 | A | * | 8/1989 | Bergami et al. ............. 257/622 |
| 5,587,344 | A | * | 12/1996 | Ishikawa ............. H01L 21/3145 257/E21.269 |
| 5,872,061 | A | | 2/1999 | Lee et al. |
| 6,306,722 | B1 | * | 10/2001 | Yang ................ H01L 21/76224 257/E21.269 |
| 6,358,818 | B1 | * | 3/2002 | Wu ............................... 438/431 |
| 7,364,825 | B2 | | 4/2008 | Lygaitis et al. |

* cited by examiner

*Primary Examiner* — David Vu
*Assistant Examiner* — Mouloucoulaye Inoussa
(74) *Attorney, Agent, or Firm* — Haynes and Boone, LLP

(57) ABSTRACT

An isolation feature with a nitrogen-doped fill dielectric and a method of forming the isolation feature are disclosed. In an exemplary embodiment, the method of forming the isolation feature comprises receiving a substrate having a top surface. A recess is etched in the substrate, the recess extending from the top surface into the substrate. A dielectric is deposited within the recess such that the depositing of the dielectric includes introducing nitrogen during a chemical vapor deposition process. Accordingly, the deposited dielectric includes a nitrogen-doped dielectric. The deposited dielectric may include a nitrogen-doped silicon oxide. In some embodiments, the depositing of the dielectric disposes the nitrogen-doped dielectric in contact with a surface of the recess. In further embodiments, a liner material is deposited within the recess prior to the depositing of the dielectric within the recess.

18 Claims, 7 Drawing Sheets

METHOD AND STRUCTURE FOR NITROGEN-DOPED SHALLOW-TRENCH ISOLATION DIELECTRIC

PRIORITY DATA

This application claims priority to Application Ser. No. 61/778,254, filed on Mar. 12, 2013, entitled "Method and Structure for Nitrogen-Doped Shallow-Trench Isolation Dielectric," the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of fabrication and verification processes for ICs, and, for improvements to be fully realized, similar developments in IC manufacturing are needed.

As merely one example, trench isolation structures, such as shallow-trench isolation structures (STIs), have proven challenging to scale down. Trench isolation structures are dielectric-filled regions sunk into a semiconductor substrate to prevent the flow of current between circuit devices. Electrical isolation generally depends on both the insulation properties of the dielectric material and the amount of dielectric disposed between the circuit devices. Merely shrinking the size of the isolation structure without changing other properties reduces the amount of insulation provided. Compounding the problem, smaller devices are often more sensitive to leakage associated with insufficient isolation. Additionally, current trends towards reduced power means that the operating environments ICs are used in are also becoming increasingly sensitive to leakage. It follows that further advances in trench isolation structures are extremely desirable in order to deliver further improvements in device scaling, power, and other performance metrics. Therefore, while existing fabrication process for forming trench isolation structures have been generally adequate, they have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
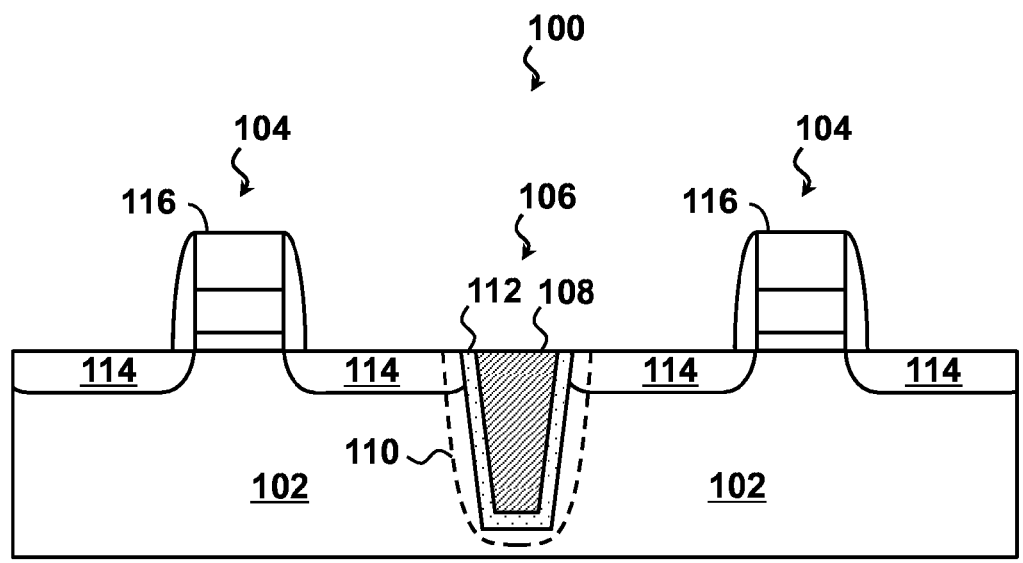
FIGS. 1A, 1B, and 1C are cross-sectional views of integrated circuits according to various aspects of the present disclosure.

The present disclosure relates generally to IC device manufacturing and more particularly, to an isolation structure with a nitrogen-doped dielectric fill material and to a method of forming the isolation structure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1A is a cross-sectional view of an integrated circuit 100 according to various aspects of the present disclosure. FIG. 1A has been simplified for the sake of clarity and to better illustrate the concepts of the present disclosure. Additional features may be incorporated into the integrated circuit 100, and some of the features described below may be replaced or eliminated for other embodiments of the integrated circuit 100.

The integrated circuit 100 includes a substrate 102 with one or more circuit devices 104 formed upon it. The circuit devices 104 may include any suitable active or passive devices including P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, diodes, resistors, capacitors, inductors, varactors, other suitable devices, and/or combinations thereof. The circuit devices 104 are electrically isolated from one another by an isolation feature 106. In many embodiments, isolation feature 106 is a shallow-trench isolation structure (STI). However, the principles of the present disclosure are not limited by the physical dimensions of the isolation feature 106 and apply equally to deep-trench isolation structures (DTIs), localized oxidation of silicon (LOCOS) structures, and other suitable isolation feature configurations.

Isolation feature 106 prevents the flow of current between circuit devices 104. Left unchecked, this leakage current would increase power draw by the circuit 100 and would result in additional waste heat. In some cases, particularly where the circuit devices 104 are analog in nature, leakage current may induce noise in device signals that may impact signal fidelity. At the extremes, leakage current can result in device malfunction and damage.

To combat the flow of current, an isolation structure 106 comprising an insulating fill or bulk dielectric 108 may be formed that extends into the substrate 102. This technique has had some success. However, in practice, it has been noted that conventional isolation structures 106 provide less insulation than expected. Upon further investigation, it has been determined that conventional fill dielectric 108 materials may lead to defects in the crystalline structure of the substrate 102, particularly in a region 110 adjacent to the isolation feature 106.

Figure 1B:
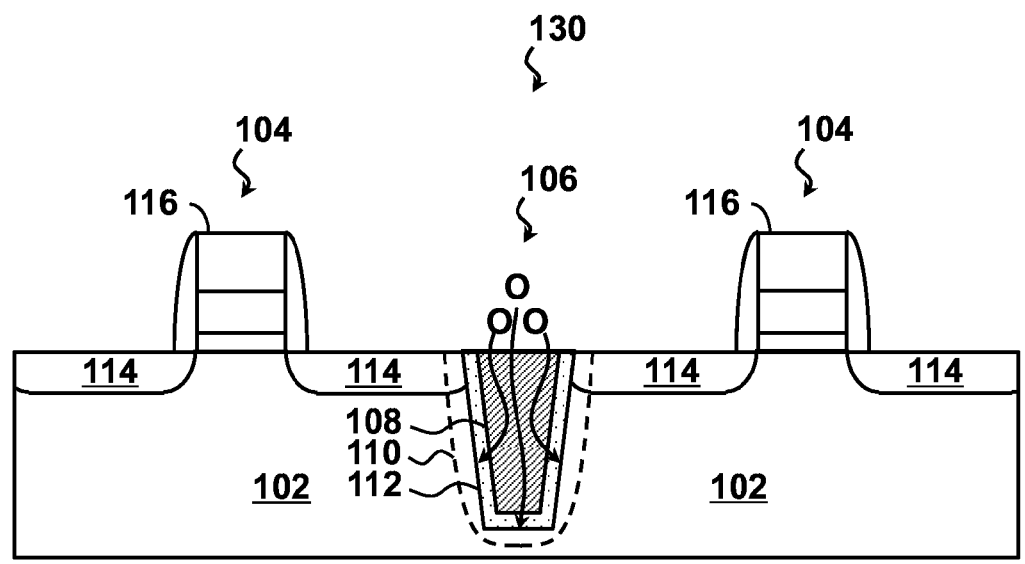

Referring now to FIG. 1B, illustrated is a cross-sectional view of an integrated circuit 130 according to various aspects of the present disclosure. FIG. 1B has been simplified for the sake of clarity. Additional features may be incorporated into the integrated circuit 130, and some of the features described below may be replaced or eliminated for other embodiments of the integrated circuit 130.

FIG. 1B illustrates one cause of these defects, re-oxidation. With a conventional isolation structure 106, oxygen used in subsequent processing step may penetrate the fill dielectric 108. For example, high-temperature oxygen-rich processes, such as those used to form a sacrificial layer, often cause oxygen to penetrate a conventional fill dielectric 108. The oxygen then forms an unintended semiconductor oxide along the substrate 102 boundary resulting in crystalline defects within the region 110. These crystalline defects have the potential to act as charge carriers, facilitating the flow of current around the isolation feature 106 and between the circuit devices 104. Crystalline defects within a semiconductor may also increase stress, which has also been shown to increase the conductivity of the semiconductor material. For these reasons and others, performing a high-temperature oxidation process with a conventional fill dielectric 108 may result in a conductive region 110 of the substrate 102 surrounding the isolation feature 106, which reduces the insulating performance.

To reduce these effects, in some embodiments, a liner 112 may be formed in the trench prior to the deposition of the fill dielectric 108. For example, a silicon oxide liner 112 or silicon nitride liner 112 may be formed prior to depositing the fill dielectric 108. Such liners 112 have improved the insulating properties of the isolation feature 106. However, they are not without drawbacks. Silicon nitride liners 112, while effective, are often deposited via high-density plasma CVD (HDP-CVD). HDP-CVD may cause plasma damage to circuit devices 104 and the substrate 102 and may cause significant heating of the substrate 102. This heating contributes to the fabrication thermal budget. Overshooting the thermal budge produces a number of adverse effects including unpredictable changes to saturation current, threshold voltage, gate voltage, and/or other performance parameters as well as poor device performance during the wafer-acceptance-testing (WAT). Accordingly, in some embodiments, reducing the number of HDP-CVD processes performed on the substrate 102 may improve performance. Furthermore, forming a silicon nitride liner 112 may include more processing steps than forming a silicon oxide liner 112 and thus increase device cost. On the other hand, silicon oxide liners 112 are not as effective in preventing re-oxidation effects.

Figure 1C:
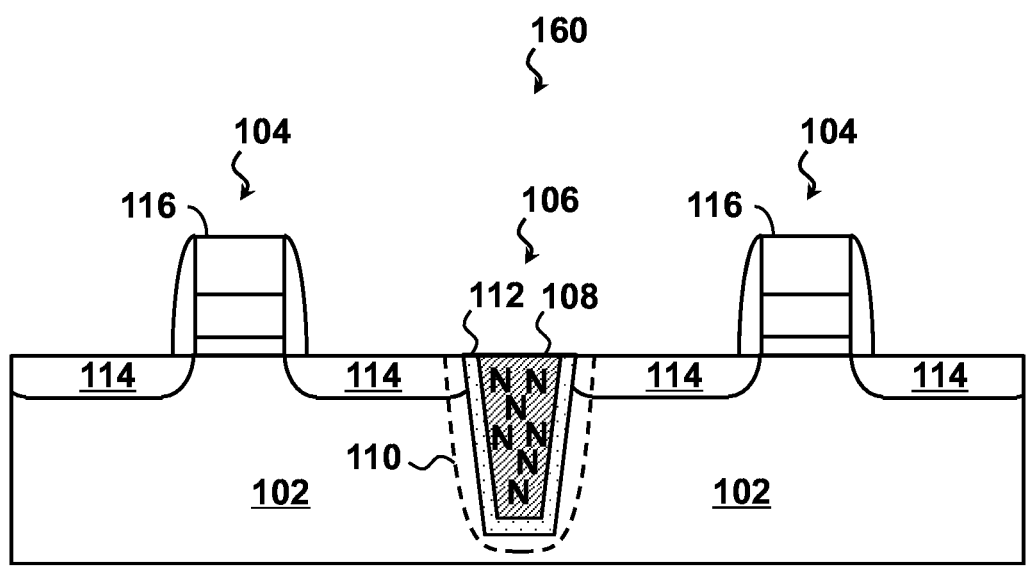

Referring now to FIG. 1C, illustrated is a cross-sectional view of an integrated circuit 160 according to various aspects of the present disclosure. FIG. 1C has been simplified for the sake of clarity. Additional features may be incorporated into the integrated circuit 160, and some of the features described below may be replaced or eliminated for other embodiments of the integrated circuit 160.

To overcome these limitations and others, in some embodiments, minute amounts of nitrogen are introduced during the deposition of the fill dielectric 108. This produces a nitrogen-doped fill dielectric 108 distinct from a semiconductor nitride dielectric and distinct from a conventional semiconductor oxynitride dielectric. For example, the nitrogen-doped fill dielectric 108 may include between about 0.4 atomic percent and about 2.0 atomic percent nitrogen, whereas conventional oxynitride may include between about 30 atomic percent and about 50 atomic percent nitrogen. The higher concentration of nitrogen in a conventional oxynitride results in a higher dielectric constant and, in turn, provides reduced insulation, making conventional oxynitride undesirable for use in an isolation feature in some applications. In contrast, the much lower ratio of nitrogen in the nitrogen-doped fill dielectric 108 results in a dielectric constant substantially similar to that of the corresponding semiconductor oxide and provides better insulation.

Compared to the corresponding semiconductor oxide, the resulting nitrogen-doped fill dielectric 108 is less likely to re-oxidize the surrounding substrate 102 and to form a conductive region 110 of the substrate 102 surrounding the isolation feature 106. The nitrogen-doped fill dielectric 108 is fully compatible with a conventional thermal oxide liner 112, and in some embodiments, the liner 112 is a conventional thermal oxide liner 112. However, in further embodiments, this reduced tendency to re-oxidize is leveraged to allow the use of a thinner liner 112. In further embodiments, the nitrogen-doped fill dielectric 108 allows the use of less protective liner 112 materials that are easier to manufacture, are more durable, are more reliable, have less impact on the substrate 102, and/or have other advantages over more protective materials. In yet further embodiments, the nitrogen-doped fill dielectric 108 is deposited without a liner 112, instead disposing the fill dielectric 108 in contact with the substrate. Accordingly, the use of a nitrogen-doped oxide fill dielectric 108 may improve isolation feature 106 insulation, reduce leakage current, reduce noise, reduce time-dependent thermal breakdown, improve overall yield, and/or provide other isolation benefits and may do so with reduced fabrication complexity and/or reduced thermal budget compared to conventional designs. Of course, these advantages are merely exemplary, and one of skill in the art will recognize further advantages of the isolation feature. No particular advantage is necessary or required for any particular embodiment.

The structure of the integrated circuit 100 will now be disclosed in more detail. As disclosed above, the integrated circuit 100 is formed on a substrate 102. In some embodiments, the substrate 102 includes an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, in one such embodiment, the substrate 102 includes an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions. For example, a region of the substrate 102 may be doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques.

In many embodiments, the substrate 102 includes one or more circuit devices 104 formed on the substrate 102. As noted above, the circuit devices 104 may include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, diodes, resistors, capacitors, inductors, varactors, other suitable devices, and/or combinations thereof.

In an exemplary embodiment, each circuit device 104 is a field effect transistor and includes doped source/drain regions 114 and a gate stack 116 disposed between the source/drain regions 114. The source/drain regions 114 have a dopant implanted therein that is appropriate for the design requirements of the associated device. Suitable p-type dopants include boron, gallium, indium, other suitable p-type dopants, and/or combinations thereof. Suitable n-type dopants include phosphorus, arsenic, other suitable n-type dopants, and/or combinations thereof. Doping may be implemented using a process such as ion implantation or diffusion in various steps and techniques.

The gate stack 116 is disposed above and between the source/drain regions 114 and defines a channel region in the substrate 102. The channel region is an active region in the substrate in which the majority carriers flow between the source and drain regions when the device is in a conduction mode as controlled by the gate stack 116. The gate stack 116 may include an interfacial layer, a gate dielectric, a gate electrode, and/or other suitable layers. The gate electrode may be a polysilicon gate, a dummy gate, a metal gate, and/or other suitable gate electrode. In that regard, the gate electrode may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof. The gate stack 116 may also include sidewall spacers formed on one or more lateral surfaces of the gate stack 116.

The circuit devices 104 are separated by an isolation feature 106. In various embodiments, isolation feature 106 takes the form of a shallow-trench isolation feature (STI), a deep-trench isolation feature, a localized oxidation of silicon (LOCOS) feature, and/or another suitable isolation feature.

The isolation feature 106 includes a fill dielectric 108 disposed into the substrate 102. The fill dielectric 108 may include semiconductor oxide such as silicon oxide. To prevent the oxide from creating a conductive region 110 of the substrate 102 adjacent to the fill dielectric 108, the isolation feature 106 may include a nitrogen-doped semiconductor oxide in the fill dielectric 108. Such a conductive region 110 is commonly caused by crystalline defects due to re-oxidation of the substrate 102 during deposition as well as other causes. In many embodiments, a fill dielectric 108 containing nitrogen-doped semiconductor oxide is less likely to cause these defects than a conventional semiconductor oxide. For these reasons and others, the nitrogen-doped semiconductor oxide fill dielectric 108 provides greater isolation with reduced leakage.

The isolation feature 106 may also include a liner 112 disposed between the fill dielectric 108 and the substrate 102 to further reduce leakage current due to crystalline defects associated with re-oxidation as well as other effects. The nitrogen-doped semiconductor oxide fill dielectric 108 is compatible with all conventional liner 112 materials and types. Accordingly, suitable materials for the liner 112 include a semiconductor nitride, a semiconductor oxide, a thermal semiconductor oxide, a semiconductor oxynitride, a polymer dielectric, and/or other suitable materials. Because the nitrogen-doped semiconductor oxide fill dielectric 108 may be less prone to form a conductive region 110 within the substrate or otherwise promote leakage, in various embodiments, a thinner liner 112 and/or alternate liner 112 materials are used. For example, a semiconductor nitride liner 112 may be more effective than a semiconductor oxide liner 112 at preventing the formation of a conductive region 110. However, a process for forming a semiconductor oxide liner 112 may use fewer processing steps and/or lower temperatures. In such embodiment, due to the reduced potential for leakage of the nitrogen-doped semiconductor oxide fill dielectric 108, a liner 112 containing a semiconductor oxide performs effectively, allowing the design to take advantage of the process advantages of such a liner 112.

Figure 2:
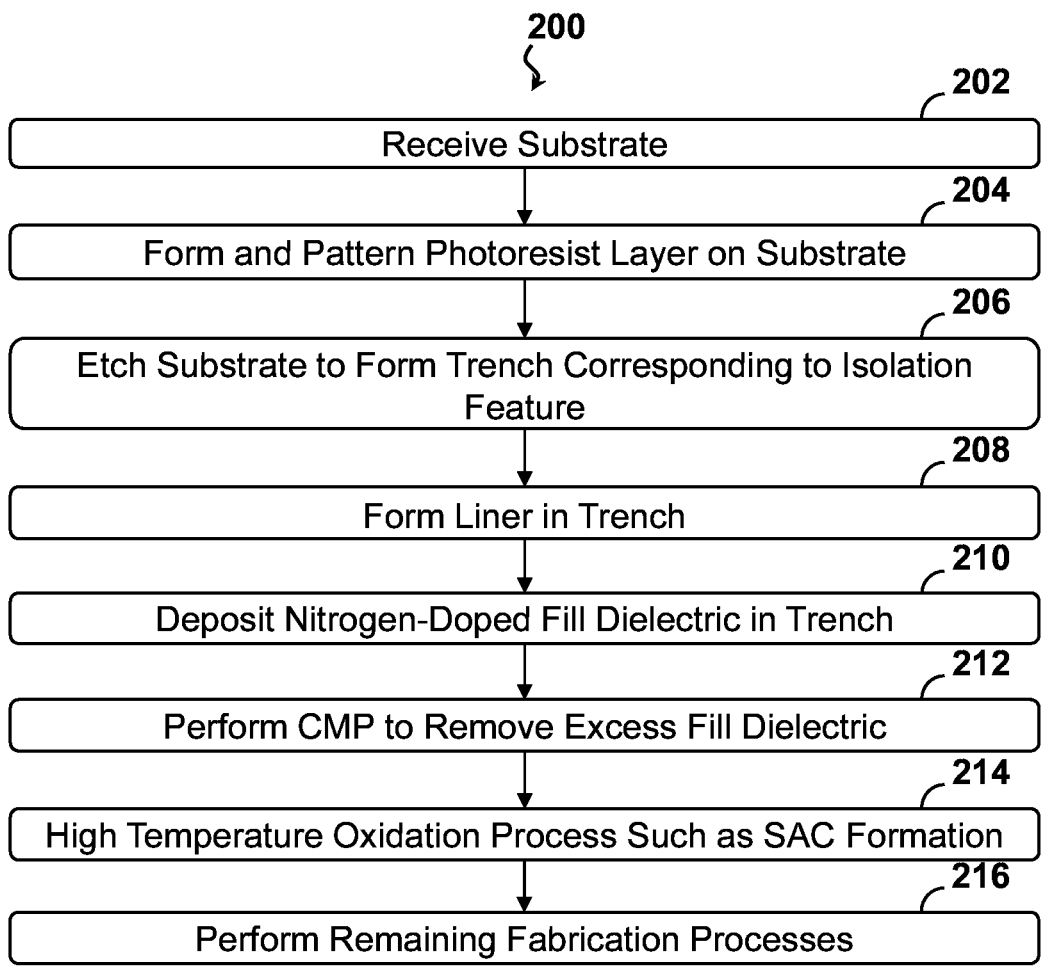
FIG. 2 is a flow diagram of the method for forming an isolation feature with a nitrogen-doped semiconductor oxide fill dielectric according to various aspects of the present disclosure.

A method for forming an isolation feature with a nitrogen-doped semiconductor oxide fill dielectric is disclosed with reference to FIG. 2 and FIGS. 3-10. FIG. 2 is a flow diagram of the method 200 for forming an isolation feature with a nitrogen-doped semiconductor oxide fill dielectric according to various aspects of the present disclosure. It is understood that additional steps can be provided before, during, and after the method 200 and that some of the steps described can be replaced or eliminated for other embodiments of the method 200. FIGS. 3-10 are cross-sectional views of an integrated circuit 300 undergoing the method 200 for forming an isolation feature with a nitrogen-doped semiconductor oxide fill dielectric according to various aspects of the present disclosure. FIGS. 3-10 have been simplified for the sake of clarity and to better illustrate the concepts of the present disclosure.

Figure 3:
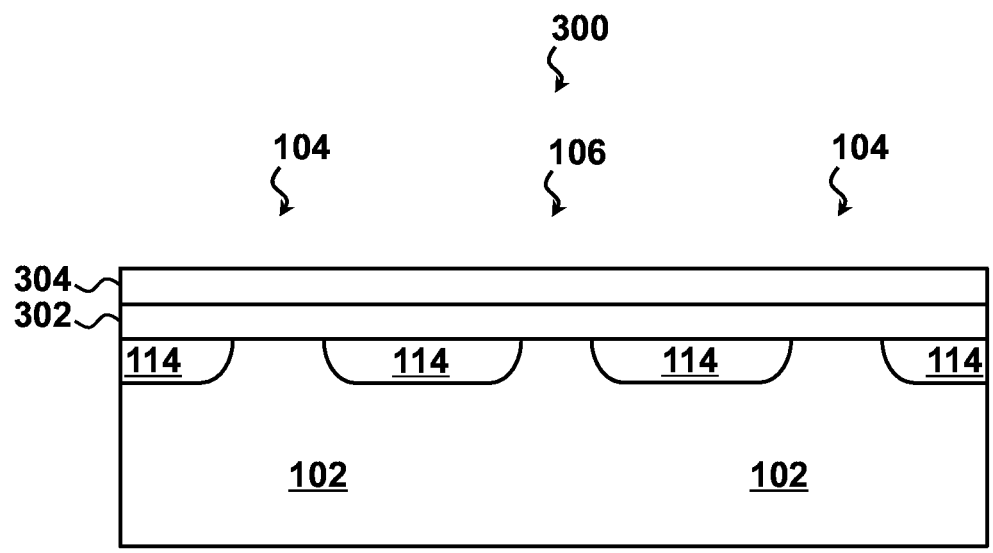
FIGS. 3-10 are cross-sectional views of an integrated circuit undergoing the method for forming an isolation feature with a nitrogen-doped semiconductor oxide fill dielectric according to various aspects of the present disclosure.

Referring to block 202 of FIG. 2 and to FIG. 3, a substrate 102 is received. The substrate 102 may be substantially similar to the substrate 102 disclosed with respect to FIGS. 1A, 1B and 1C and, in that regard, may include circuit devices 104 disposed upon the substrate 102. The circuit devices 104 may be any suitable active or passive devices including P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, diodes, resistors, capacitors, inductors, varactors, other suitable devices, and/or combinations thereof. In some embodiments of the method 200, elements of the circuit devices 104 such as gate stacks may not have been fabricated prior to the formation of the isolation feature 106 and may be fabricated subsequently.

In some embodiments, the substrate 102 includes hard mask layers such as a pad oxide 302 and/or a pad nitride 304 used in forming the isolation feature 106. In one such embodiment, the pad oxide 302 includes a thermal semiconductor oxide disposed above the substrate 102. The pad nitride 304 may include a semiconductor nitride deposited by low-pressure chemical vapor deposition (LPCVD) and may be formed over the pad oxide 302.

Figure 4:
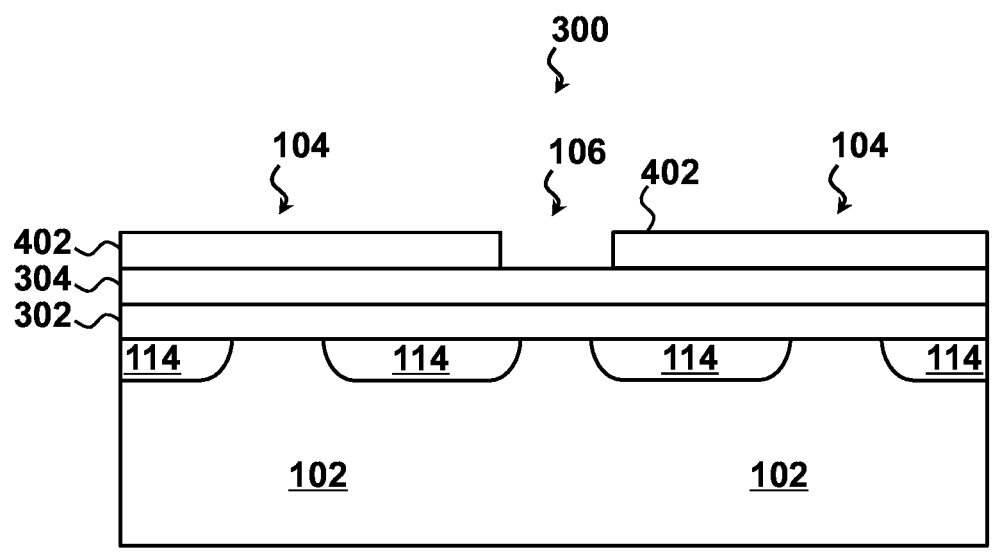

Referring to block 204 of FIG. 2 and to FIG. 4, a photoresist 402 is formed on the substrate 102 and patterned to expose a region of the substrate 102 corresponding to an isolation feature 106. The patterning of the photoresist 402 may include soft baking, mask aligning, exposure, post-exposure baking, developing the photoresist 402, rinsing, and drying (e.g., hard baking). Alternatively, the photolithographic process may be implemented, supplemented, or replaced by other methods such as maskless photolithography, electron-beam writing, and ion-beam writing.

Figure 5:
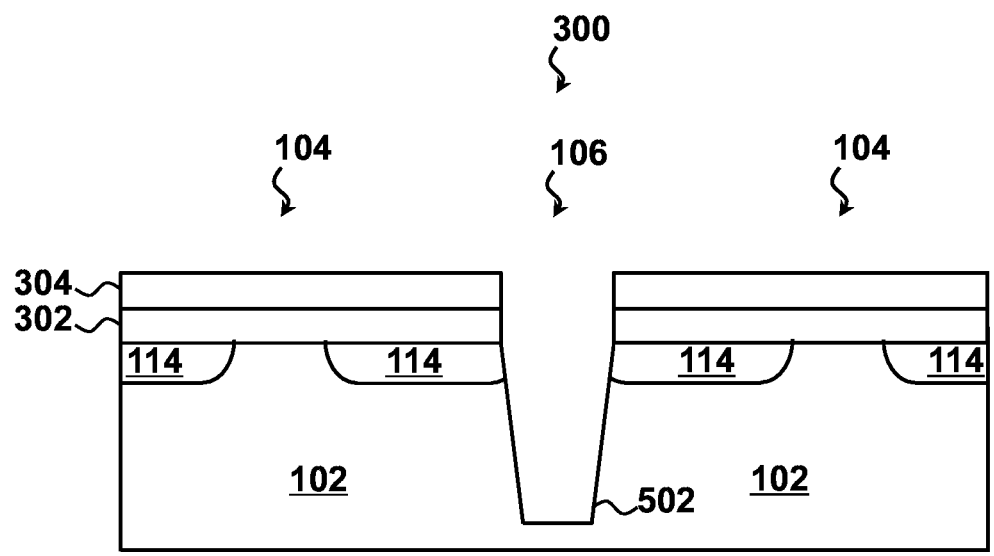

Referring to block 206 of FIG. 2 and to FIG. 5, the substrate 102 is etched to form a trench 502 or recess corresponding to the isolation feature 106. In some embodiments, a single etching process etches the substrate 102 based on the patterned photoresist 402. This may be performed without the use of a hard mask. In contrast, in some embodiments, etching includes opening the hard mask (e.g., pad oxide 302 and pad nitride 304) of the substrate 102, removing the photoresist 402, and etching the substrate 102 underlying the opened portion of the hard mask. The hard mask may be opened using any suitable dry etching, wet etching, and/or other suitable etching process. Likewise, the etching of the substrate 102 may include any suitable dry etching, wet etching, and/or other suitable etching process. In an embodiment, the substrate 102 is etched using a dry etching process using a fluorine-based etchant. The etching is configured to produce a trench 502 of any suitable width and depth extending from the top surface of the substrate 102 into the substrate 102.

Figure 6:
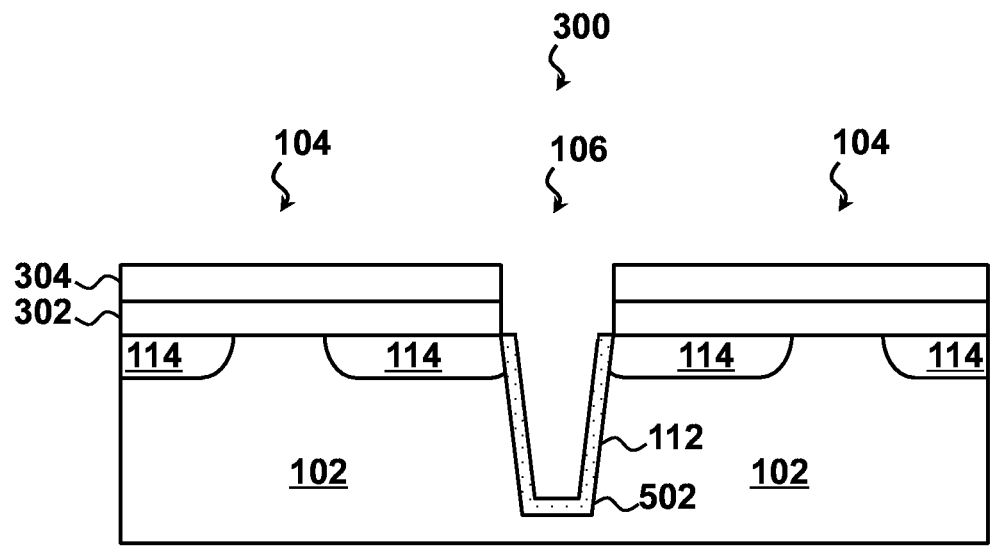

Referring to block 208 of FIG. 2 and to FIG. 6, a liner 112 may be formed in the trench 502. The liner 112 reduces crystalline defects at the interface between the substrate 102 and the isolation feature 106. The liner 112 may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, atomic layer deposition (ALD), chemical vapor deposition (CVD), high-density plasma CVD (HDP-CVD), physical vapor deposition (PVD), and/or other suitable deposition processes. In some embodiments, the liner 112 includes a conventional thermal oxide liner 112 formed using conventional techniques. The liner 112 may also include a semiconductor nitride formed via HDP-CVD. However, HDP-CVD may cause plasma damage to circuit devices 104 and may cause significant heating of the substrate 102. Accordingly, in some embodiments, it may be advantageous to reduce the number of HDP-CVD processes performed to forming an isolation feature. Therefore, the integrated circuit 300 may take advantage of the reduced potential for defects of a nitrogen-doped fill dielectric and may include an alternate liner 112 material and/or a liner 112 material formed via a process other than HDP-CVD. In further embodiments, due to the reduced potential for defects, the liner 112 is omitted.

Figure 7:
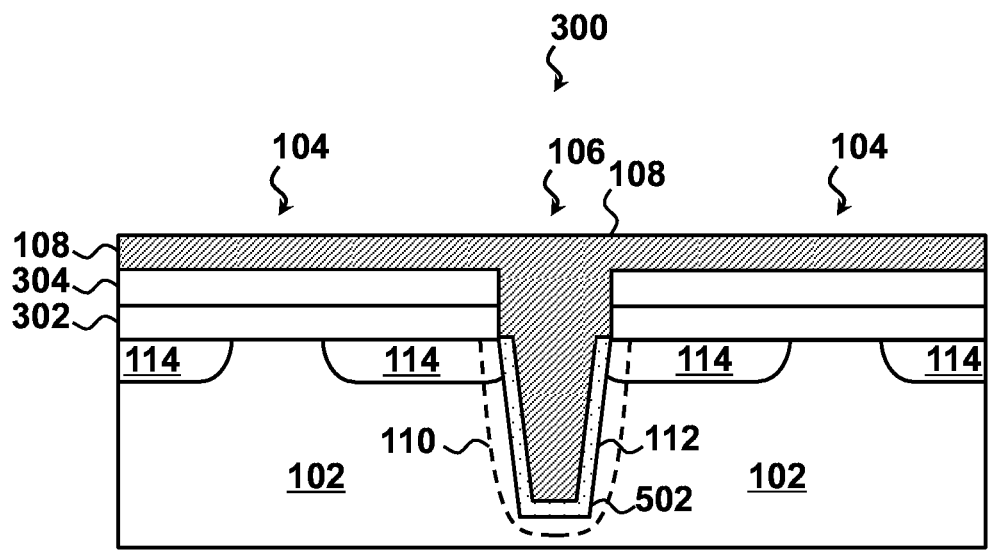

Referring to block 210 of FIG. 2 and to FIG. 7, a fill dielectric 108 is deposited within the trench 502. To reduce the tendency of the fill dielectric 108 to cause defects in the substrate 102 in the region 110 adjacent to the trench 502, nitrogen may be introduced during the deposition of the fill dielectric 108. This deposits a nitrogen-doped fill dielectric 108. Exemplary deposition processes will now be disclosed for forming a nitrogen-doped silicon oxide, but one of skill in the art will recognize that other nitrogen-doped semiconductor oxides are both contemplated and provided for. In various exemplary embodiments, the fill dielectric 108 is formed using a CVD deposition process. In one such embodiment, the deposition process is performed at an ambient total pressure within the CVD chamber of about 11 mTorr. Silane ($SiH_4$) gas is supplied at a flow rate between about 120 sccm (standard cubic centimeters per minute) and about 160 sccm. Argon (Ar) is supplied at between about 116 sccm and about 136 sccm argon. Oxygen ($O_2$) is supplied at between about 220 sccm and about 290 sccm. Nitrogen ($N_2$) is supplied at between about 2 sccm and 10 sccm. Thus, the CVD is performed using a nitrogen to oxygen flow ratio of between about 1:100 and about 1:22. This deposition process produces a nitrogen-doped silicon oxide fill dielectric 108 that is distinct from both silicon nitride and silicon oxynitride. For example, the nitrogen-doped dielectric 108 may include between about 0.4 atomic percent and about 2.0 atomic percent nitrogen, whereas conventional oxynitride may include between about 30 atomic percent and about 50 atomic percent nitrogen. The higher concentration of nitrogen in a conventional oxynitride results in a greater dielectric constant and provides reduced insulation, making the conventional oxynitride undesirable for use in an isolation feature in some applications. In contrast, the much lower ratio of nitrogen in the nitrogen-doped fill dielectric 108 results in a dielectric constant substantially similar to that of silicon oxide. Furthermore, conventional oxynitrides are often formed by a different process (PECVD using $SiH_4$ and $N_2O$) than the exemplary nitrogen-doped dielectric 108 (HDP-CVD using $SiH_4$, $O_2$, and $N_2$). For embodiments in which more than one iteration of a CVD deposition process is used to form layers of fill dielectric 108, nitrogen may be introduced during one, some, or all of the CVD deposition processes.

Figure 8:
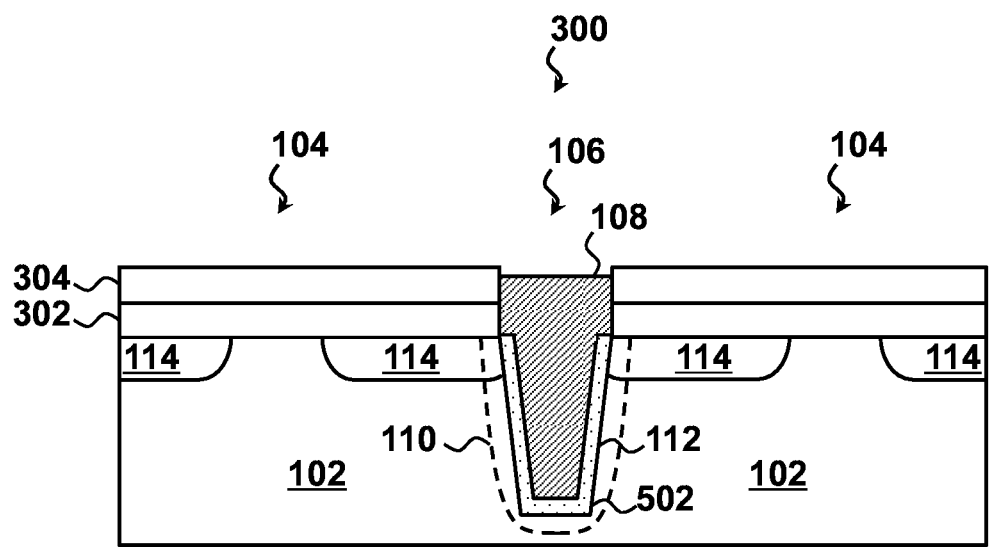

Referring to block 212 of FIG. 2 and to FIG. 8, a CMP process may be performed following the deposition of the fill dielectric 108. In some embodiments, a hard mask layer (e.g., pad nitride 304) is used as a polish stop. Following the CMP process, the hard mask layers (e.g., pad oxide 302 and pad nitride 304) may be removed. In some embodiments, a thermal annealing process is performed on the substrate 102 after deposition of the fill dielectric 108.

Figure 9:
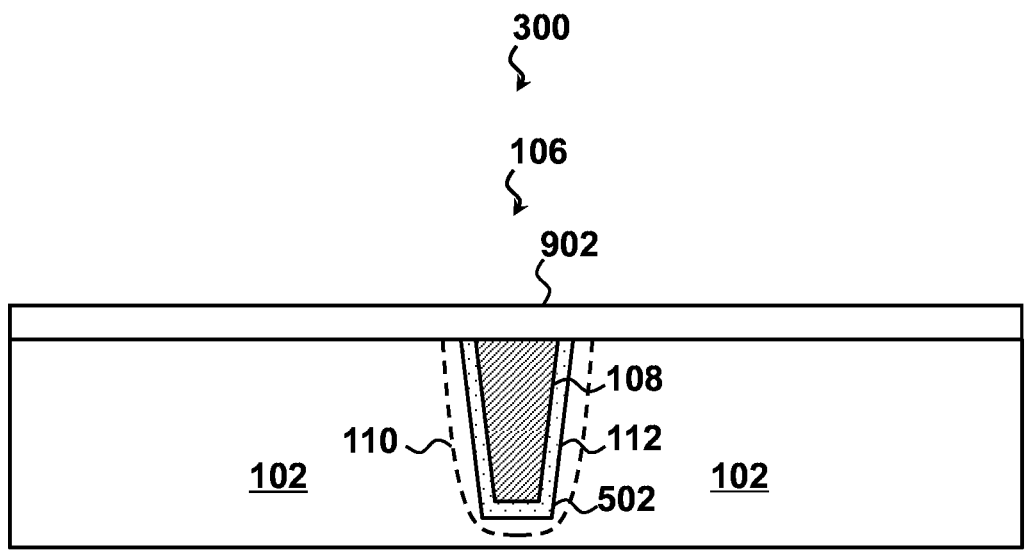

Referring to block 214 of FIG. 2 and to FIG. 9, subsequent fabrication process may be performed the substrate including high-temperature oxidation processes. For example, a subsequent fabrication process may be used to form an oxygen-containing layer 902 on the substrate 102. The oxygen-containing layer 902 may include any semiconductor oxide, semiconductor oxynitride, or other oxygen-containing material and may take any suitable form including that of a deposited or thermally-grown oxygen-containing material. In some embodiments, the oxygen-containing layer 902 is a sacrificial oxide layer used to protect portions of the substrate 102 during implantation. In one such embodiment, forming the oxygen-containing layer 902 includes heating the substrate 102 to about 920° C. and exposing the substrate 102 to $O_2$ gas to form the oxygen-containing layer 902. As disclosed above, oxygen has a tendency to penetrate a conventional fill dielectric 108 and a conventional liner 112 resulting in crystalline dislocations in a region 110 adjacent to the isolation feature 106. However, the unique properties of the nitrogen-doped fill dielectric 108 dramatically reduce the tendency of these dislocations to form. For this reason and others, the nitrogen-doped fill dielectric 108 produces an isolation feature 106 that provides considerably greater electrical isolation.

Figure 10:
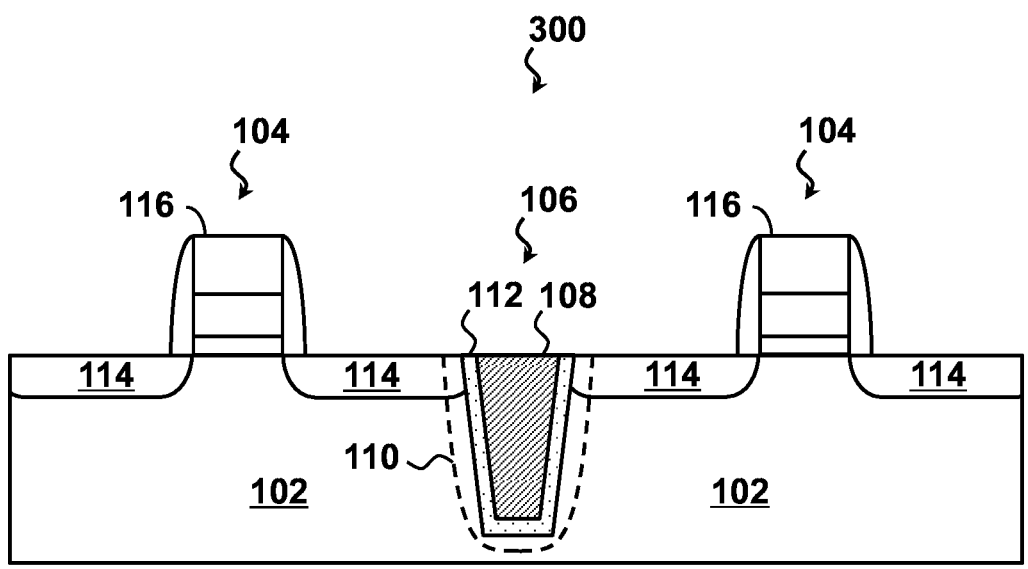

Referring to block 216 of FIG. 2 and to FIG. 10, remaining fabrication processes may be performed on the substrate 102. In some embodiments, these processes include the formation of further circuit devices, gate stacks 116, interconnects, and/or other processes known to one of skill in the art.

Thus, the present disclosure provides an isolation feature with a nitrogen-doped fill dielectric and a method of forming the isolation feature. In some embodiments, a method of forming an isolation feature is provided. The method comprises receiving a substrate having a top surface; etching a recess in the substrate, the recess extending from the top surface into the substrate; and depositing a dielectric within the recess, wherein the depositing of the dielectric includes introducing nitrogen during a chemical vapor deposition process, whereby the deposited dielectric includes a nitrogen-doped dielectric. In some such embodiments, the deposited dielectric includes a nitrogen-doped silicon oxide.

In further embodiments, a method of fabricating an integrated circuit is provided. The method comprises receiving a substrate having a first circuit device and a second circuit device disposed upon the substrate; etching a trench extending into the substrate, the trench disposed between the first circuit device and the second circuit device; and depositing a nitrogen-doped dielectric within the trench, wherein the depositing of the nitrogen-doped dielectric includes introducing nitrogen during the depositing. In some such embodiments, the introducing of nitrogen during the deposition process introduces gas at a flow rate ratio for nitrogen gas ($N_2$) to oxygen gas ($O_2$) of between about 1:100 and about 1:22.

In yet further embodiments, an integrated circuit is provided comprising a substrate having a first circuit device and a second circuit device formed thereupon; and an isolation structure disposed between the first circuit device and the second circuit device, wherein the isolation structure includes a nitrogen-doped semiconductor oxide disposed between the first circuit device and the second circuit device and extending into the substrate. In some such embodiments, the nitrogen-doped semiconductor oxide directly contacts a semiconductor material of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an isolation feature, the method comprising:
   receiving a substrate having a top surface;
   etching a recess in the substrate, the recess extending from the top surface into the substrate; and
   depositing a dielectric within the recess,
      wherein the depositing of the dielectric includes introducing nitrogen during a chemical vapor deposition process,
      whereby the deposited dielectric includes a nitrogen-doped dielectric, and
      wherein the introducing of nitrogen during the chemical vapor deposition process introduces gas at a flow rate ratio for nitrogen gas ($N_2$) to oxygen gas ($O_2$) of between about 1:100 and about 1:22.

2. The method of claim 1, wherein the deposited dielectric includes a nitrogen-doped silicon oxide.

3. The method of claim 1, wherein the depositing of the dielectric disposes the nitrogen-doped dielectric in contact with a surface of the recess.

4. The method of claim 1 further comprising depositing a liner material within the recess prior to the depositing of the dielectric within the recess.

5. The method of claim 4, wherein the liner material includes a semiconductor oxide.

6. The method of claim 1, wherein the introducing of nitrogen during the chemical vapor deposition process introduces the nitrogen gas ($N_2$) at a flow rate between about 2 and about 10 standard cubic centimeters per minute.

7. The method of claim 6, wherein the depositing of the dielectric further includes introducing the oxygen gas ($O_2$) at a flow rate between about 220 and about 290 standard cubic centimeters per minute.

8. The method of claim 1, wherein the depositing of the dielectric further includes a plurality of iterations of a chemical vapor deposition process, and wherein the introducing of the nitrogen during the chemical vapor deposition process introduces the nitrogen during each of the plurality of iterations.

9. A method of fabricating an integrated circuit, the method comprising:
   receiving a substrate having a first circuit device and a second circuit device disposed upon the substrate;
   etching a trench extending into the substrate, the trench disposed between the first circuit device and the second circuit device; and
   depositing a nitrogen-doped dielectric within the trench,
      wherein the depositing of the nitrogen-doped dielectric includes introducing nitrogen during the depositing, and
      wherein the introducing of nitrogen during the depositing introduces gas at a flow rate ratio for nitrogen gas ($N_2$) to oxygen gas ($O_2$) of between about 1:100 and about 1:22.

10. The method of claim 9, wherein the deposited nitrogen-doped dielectric includes a nitrogen-doped silicon oxide dielectric.

11. The method of claim 9, wherein the depositing disposes the nitrogen-doped dielectric in contact with a semiconductor material of the substrate within the trench.

12. The method of claim 9 further comprising depositing a liner material within the trench prior to the depositing the nitrogen-doped dielectric.

13. The method of claim 12, wherein the liner material includes a semiconductor oxide.

14. The method of claim 9, wherein the introducing of the nitrogen during the depositing introduces the nitrogen gas ($N_2$) at a flow rate between about 2 and about 10 standard cubic centimeters per minute.

15. The method of claim 14, wherein the depositing of the nitrogen-doped dielectric further includes introducing the oxygen gas ($O_2$) at a flow rate between about 220 and about 290 standard cubic centimeters per minute.

16. A method comprising:

receiving a substrate having an isolation region defined thereupon, wherein the isolation region includes a trench extending into the substrate;

forming an isolation feature within the isolation region, wherein the forming of the isolation feature includes:

depositing a liner material on the substrate within the trench; and depositing a fill dielectric on the liner material within the trench such that the fill dielectric contains between about 0.4 atomic percent and about 2.0 atomic percent nitrogen, wherein the depositing of the fill dielectric includes performing a chemical vapor deposition process using a nitrogen to oxygen flow ratio of between about 1:100 and about 1:22.

17. The method of claim 16, wherein the depositing of the liner material is configured to deposit the liner material to include a semiconductor oxide.

18. The method of claim 4, wherein the liner material includes a semiconductor nitride.

* * * * *